(12) United States Patent
Bellezza

(10) Patent No.: US 11,380,833 B1
(45) Date of Patent: Jul. 5, 2022

(54) THERMOELECTRIC DEVICE ASSEMBLY WITH FUSION LAYER STRUCTURE SUITABLE FOR THERMOELECTRIC SEEBECK AND PELTIER DEVICES

(71) Applicant: Anthony Paul Bellezza, Parkesburg, PA (US)

(72) Inventor: Anthony Paul Bellezza, Parkesburg, PA (US)

( * ) Notice: Subject to any disclaimer, the term of this patent is extended or adjusted under 35 U.S.C. 154(b) by 0 days.

(21) Appl. No.: 17/001,544

(22) Filed: Aug. 24, 2020

Related U.S. Application Data

(63) Continuation of application No. 15/144,630, filed on May 2, 2016, now Pat. No. 10,756,248, which is a continuation-in-part of application No. 12/547,222, filed on Aug. 25, 2009, now abandoned.

(60) Provisional application No. 61/092,929, filed on Aug. 29, 2008.

(51) Int. Cl.
| | |
|---|---|
| *H01L 35/32* | (2006.01) |
| *H02H 1/00* | (2006.01) |
| *H01L 35/30* | (2006.01) |
| *H01L 35/34* | (2006.01) |

(52) U.S. Cl.
CPC .............. *H01L 35/32* (2013.01); *H01L 35/30* (2013.01); *H01L 35/34* (2013.01)

(58) Field of Classification Search
CPC .......... H01L 35/32; H01L 35/30; H01L 35/34
See application file for complete search history.

(56) References Cited

U.S. PATENT DOCUMENTS

2003/0217766 A1* 11/2003 Schroeder ............... H01L 35/30
  136/230
2004/0246650 A1* 12/2004 Grigorov ................ H01L 35/32
  361/212

* cited by examiner

*Primary Examiner* — Jayne L Mershon
(74) *Attorney, Agent, or Firm* — Lyman Smith; Patent Service Associates, Inc.

(57) ABSTRACT

A new class of thermoelectric and energy conversion apparatus, that enhances the efficiency of converting one form of energy to another using a wide range of energy conversion materials. The new method of stimulating greater electrical conversion using polymers and thermoelectric composite materials that have unique properties similar to commercial superconductors. The invention entails processes that create and interconnect the superconducting polymer layers through an assembly lowering internal resistance, impeding phonon conduction and stimulating increase in electron flow through the device with increased electrical power. The invention includes the use of dopants that are mixed with a polymer solution to build superconducting polymer connections between the thermoelectric device layers.

20 Claims, 21 Drawing Sheets

Fig. 2

HOT AND COLD LAYERS METAL BAR STOCK PROCCESS

Figure 1A:
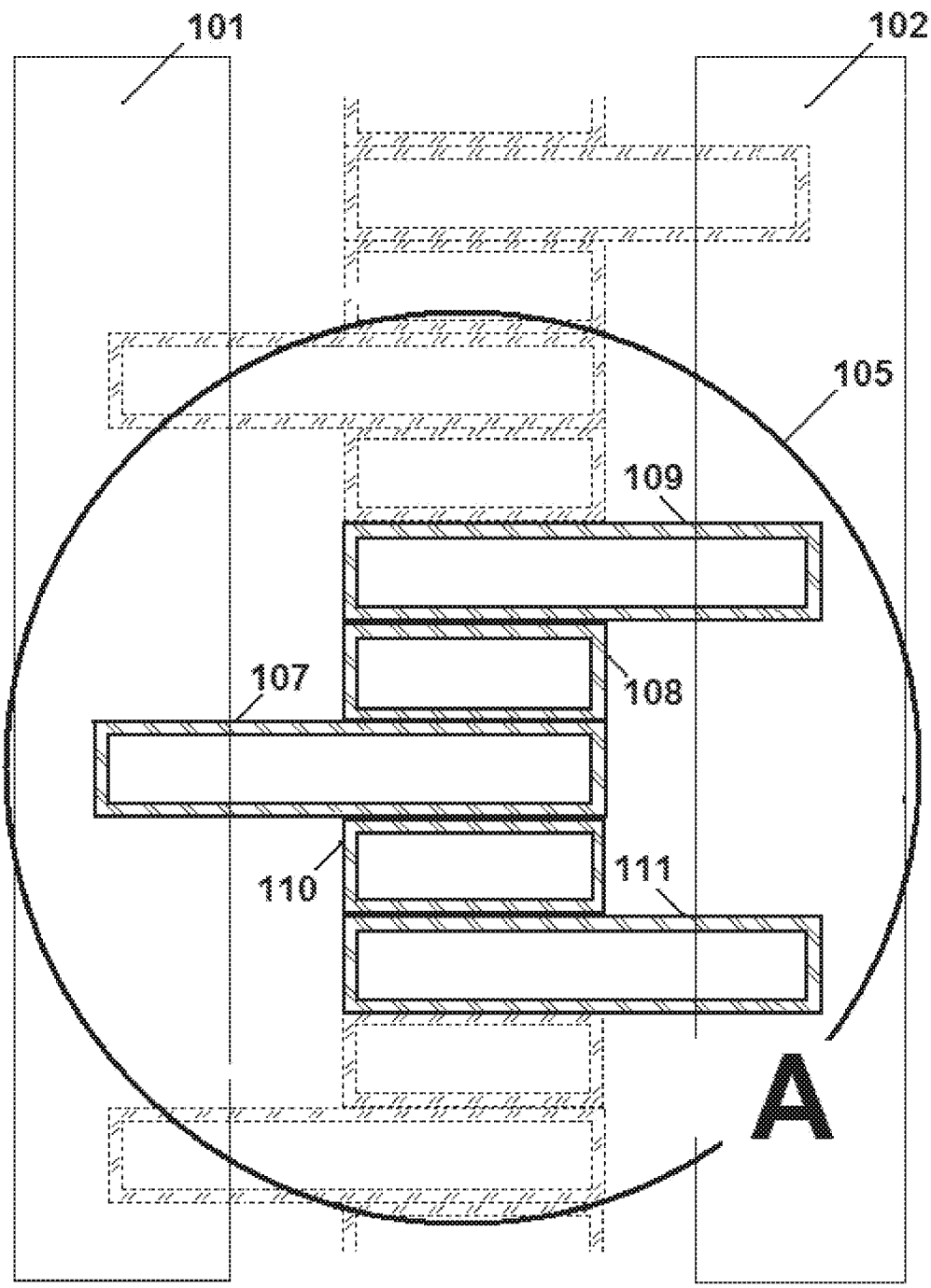

- Cut hot and cold layers to appropriate size. [201]
- Coat layers using atactic polypropylene or propylene glycol - coating processes. [202]
- Cure coating using superconducting polymer curing process [203]

Fig. 3

HOT AND COLD LAYERS POWDER METAL PROCCESS

- Form hot and cold layers under pressure into appropriate size and density of 88-98% using copper powder material in the micro to nanometer size range. [301]
- Sinter and anneal hot and cold layers in reducing atmosphere near the melting temperature of copper. [302]
- Coat hot and cold layer using atactic polypropylene or propylene glycol - coating processes [303]
- Cure coating using superconducting polymer curing process [304]

Fig. 4

HOT AND COLD LAYERS PROCESS WITH INTEGRAL SEMICONDUCTOR LAYER

Supply formed layers. [401]

Deposit a layer of N-Type or P-Type semiconductor material using but not limited to electro plating, vapor deposition, vacuum deposition or plasma sputtering processes. [402a]

Alternative to [402a] deposit a composite layer of N-Type or P-Type semiconductor material particles suspended in a polymer using any appropriate process. [402b]

Coat semiconductor layer using atactic polypropylene or propylene glycol - coating processes [403]

Cure coating using the superconducting polymer curing process [404]

Fig. 5

SEMICONDUCTOR LAYER FORMATION - BRIDGEMAN MOLDING PROCESS

Measure P-Type or N-Type semiconductor material in the proper proportion [500]

Mix the P-Type or N-Type semiconductor material. [501]

Melt the P-Type or N-Type semiconductor mixture. [502]

Cool mixture slowly to form thermoelectric ingot. [503]

Slice the ingot into layers of appropriate size. [504]

Lapping, grinding or polishing. [505]

Anneal the layers in a reducing atmosphere. [506]

Optional Coating of layer with metal ion diffusion barrier. [507]

Coat the semiconductor layer using atactic polypropylene or propylene glycol - coating processes. [508]

Cure coating using superconducting polymer curing process. [509]

Fig. 6

SEMICONDUCTOR LAYER FORMATION and CONCURRENT SUPERCONDUCTING POLYMER COATING

DIRECT MELTING PROCESS

Measure P-Type or N-Type semiconductor material in the proper proportion. [601]

Melt measured semiconductor material in carbon crucible. [602]

Form mold cavity the thickness of finished layers from fly ash, sand or other mold material with propylene glycol or Atactic Polypropylene solution. [603]

Pour molten measured semiconductor material into mold. [604]

Heated solution produces thick white fumes as semiconductor material cools. [605]

Remove coated semiconductor material from mold. [606]

Cut material into appropriate layer sizes. [607]

Fig. 7

SEMICONDUCTOR LAYER FORMATION

POWDERED METAL PROCESS

Measure P-Type or N-Type semiconductor material in the proper proportion. [701]

Form measured semiconductor layers under pressure into appropriate size and density of 90-98% using powder semiconductor material in the micrometer to nanometer size range. [702]

Sinter and Anneal layer in reducing atmosphere at a temperature of near melting temperature. [703]

Perform Lapping, grinding or polishing of layer surfaces. [704]

Anneal layer in reducing atmosphere. [705]

Optional coating of layer with metal ion diffusion barrier. [706]

Coat layer using atactic polypropylene or propylene glycol - coating processes. [707]

Cure coating using superconducting polymer curing process. [708]

Fig. 8

PROPYLENE GLYCOL
COATING PROCESS

- Pour propylene glycol into container approximately 1/8 to 1/4" deep. [801]
- Set screen into container suspended above the propylene glycol. [802]
- Suspend recipient substrate on a screen that placed above the level of the propylene glycol. [803]
- Cover the container partially. [804]
- Apply heat until white fumes/mist fills the container. [805]
- Fume/mist substrate for 20 minutes allowing propylene gerivative to form and coat the substrate. [806]
- Cure coating using superconducting polymer curing process [807]

Fig. 9

ATACTIC POLYPROPYLENE
COATING PROCESS

Supply atactic polypropylene, heptane and a dopant. [900]

Dissolve atactic polypropylene in heptane. [901]

Add a dopant to the solution. [902]

Dip, spray coat, brush, sponge or any other application method to coat the layer with the solution. [903]

Apply atactic polypropylene solution to layer using any method. [904]

Cure coating using superconducting polymer curing process [905]

Fig. 10

SUPERCONDUCTING POLYMER
CURING PROCESS

```
┌─────────────────────────────────────────────────────────────────────────┐
│ Expose both sides of coated substrate or layer to UV light for one hour.│
│ (this step and following two steps may be combined or performed in any  │
│ order). [1001]                                                          │
└─────────────────────────────────────────────────────────────────────────┘
                                    │
┌─────────────────────────────────────────────────────────────────────────┐
│ Expose both sides of substrate or layer to microwave radiation for five │
│                          minutes. [1002]                                │
└─────────────────────────────────────────────────────────────────────────┘
                                    │
┌─────────────────────────────────────────────────────────────────────────┐
│ Heat substrate or layer on hot surface to 100deg.C for ten minutes.[1003]│
└─────────────────────────────────────────────────────────────────────────┘
                                    │
┌─────────────────────────────────────────────────────────────────────────┐
│                    Cool coated layer in air. [1004]                     │
└─────────────────────────────────────────────────────────────────────────┘
```

Fig. 11

ELECTRIC FIELD CONDITIONING
ENERGY CONVERTER ASSEMBLLY
(to insure superconductivity and electrical contact between layers and coatings)

Connect the negative terminal of a power source (DC power supply or pulse width modulator) to all of the hot layers and the positive terminal to all of the cold layers, placing the P-Type and N-Type semiconductors in a parallel electrical circuit. [1101]

Energize the power source for a time that is a function of the paramaters of the apparatus to condition the conductive paths. [1102]

Energize the power source with the terminals reversed for a time that is a function of the paramaters of the apparatus to condition the semiconductor paths. [1103]

Confirm conditioning of entire apparatus by measuring its conductivity with the parallel circuit removed. [1104]

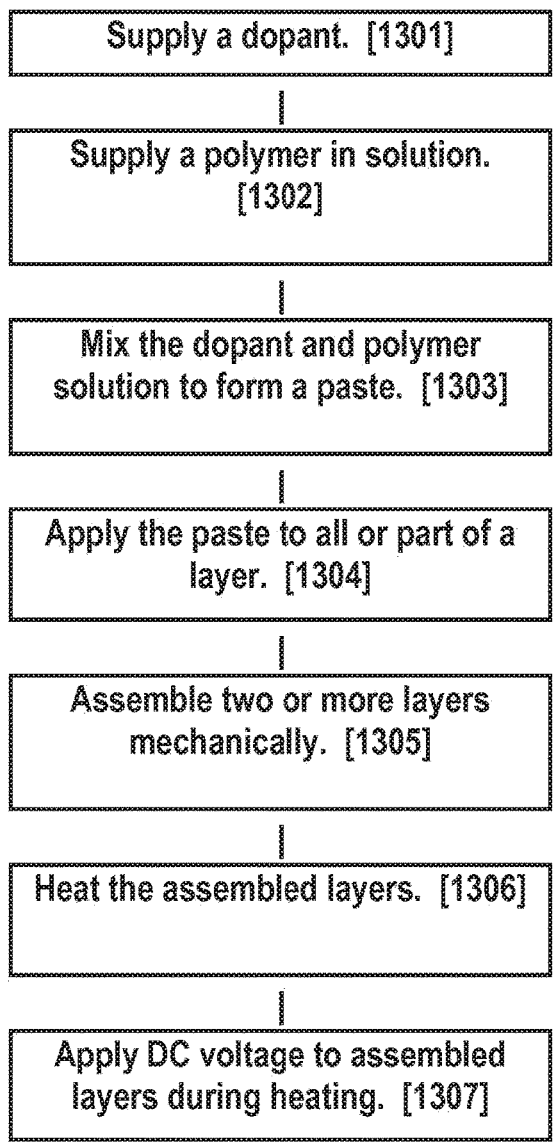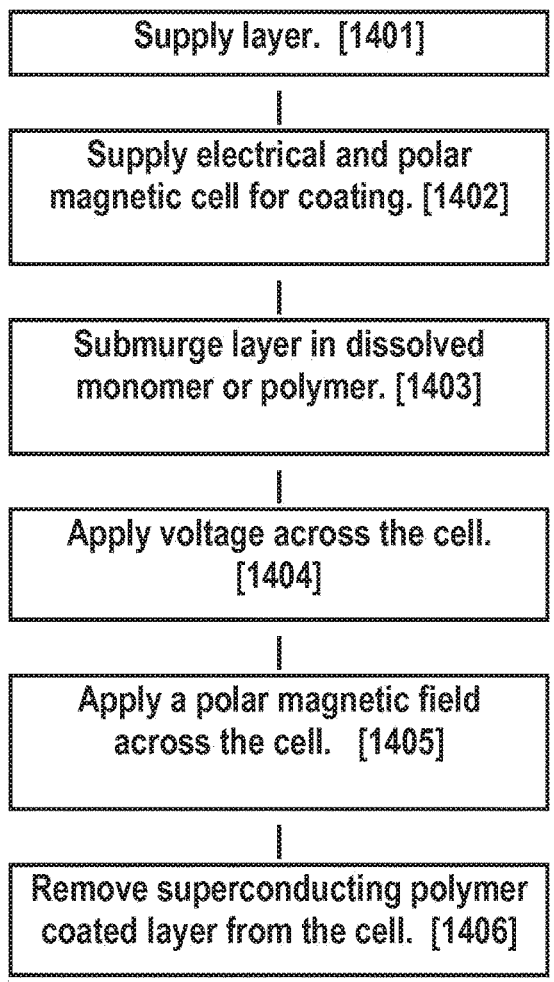

Fig. 15

SUPERCONDUCTING POLYMER COATING OF ASSEMBLED DEVICE USING ELECTRO-DEPOSITION PROCESS

Supply assembled layers. [1501]

Supply electrical and magnetic cell for coating. [1502]

Submurge assembled layers in dissolved monomer, polymer or doped polymer. [1503]

Apply voltage across the cell. [1504]

Apply a polar magnetic field across the cell. [1505]

Remove coated and assembled layers from the cell. [1506]

Fig. 16
SUPERCONDUCTING POLYMER COATING OF SEMICONDUCTOR LAYER

Measure P-Type or N-Type semiconductor material in the proper proportion. [1601]

Supply a solution of a polymer, solvent and dopant. [1602]

Form carbon mold cavity the thickness of finished layers. [1603]

Insulate contact edges of the mold. [1604]

Apply polymer solution to mold halves. [1605]

Assemble mold with clamp. [1606]

Electrify mold halves. [1607]

Melt semiconductor material in a carbon crucible. [1608]

Pour semiconductor material into mold cavity. [1609]

Observe conductivity of molded layer. [1610]

Disassemble mold to extract superconducting polymer coated semiconductor layer. [1611]

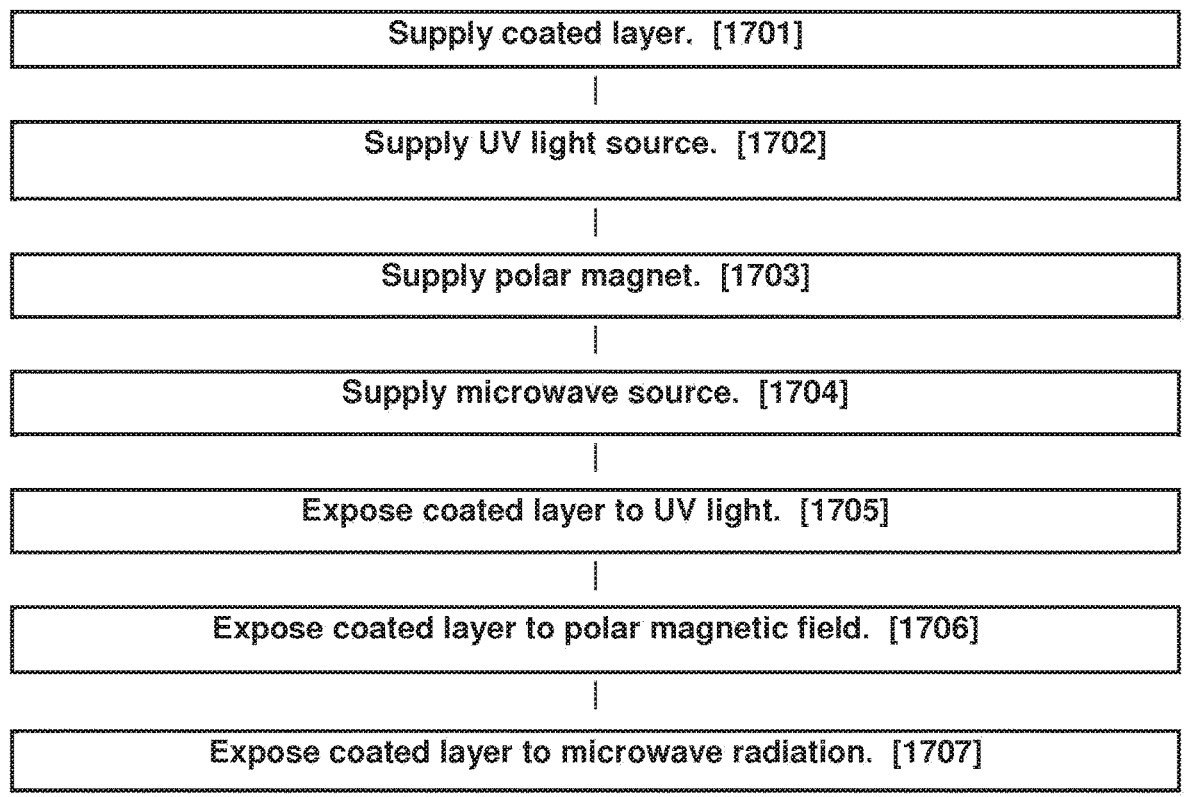

Fig. 18
FURTHER ACTIVATING SUPERCONDUCTIVITY of DOPED POLYMER COATED LAYERS

Supply assembled layers. [1801]

Supply heat source and direct towards hot layer. [1802]

Supply heat sink and direct towards cold layer. [1803]

Supply pulsating DC current to layer electrical connection with DC power supply or pulse width modulator. [1804]

Ionized polarons will cross between P-Type and N-Type semiconductors carrying electrons through the superconducting polymer. [1805]

Polymer coating will impede phonons flow. [1806]

Pulsating current accelerates electron flow making superconducting polymer threads. [1807]

Electrons separate from phonons enhancing the voltage and current flow from the layers. [1808]

Enhanced flow of electrons triggers Peltier, magnetocaloric and electrocaloric effect causing cold layer to be cool. [1809]

Increased temperature difference across the semiconductor layers increases Seebeck effect yielding higher voltage and current output. [1810]

Fig. 20
CRYOGENIC MEMBER
INSTALLATION PROCESS

Supply cryogenic cooling source operating at cryogenic temperature. [2001]

Supply thermoelectric stack requiring application of pressure to improve contact between layers. [2002]

Supply cryogenic treatable member having a smaller inner dimension than the outer dimension of the thermoelectric stack. [2003]

Cool cryogenic treatable member to cryogenic temperature in the cryogenic cooling source. [2004]

Supply a mechanical device for stretching cryogenic treatable members. [2005]

Stretch cryogenic treatable member to a larger inner dimension than the outer dimension of the thermoelectric stack. [2006]

Assemble cryogenic treatable member around thermoelectric stack before appreciable member temperature rise. [2007]

Allow cryogenically treatable member to warm to room temperature causing shrinkage of the member thereby applying pressure to the thermoelectric stack. [2008]

THERMOELECTRIC DEVICE ASSEMBLY WITH FUSION LAYER STRUCTURE SUITABLE FOR THERMOELECTRIC SEEBECK AND PELTIER DEVICES

CROSS-REFERENCE TO RELATED APPLICATIONS

This application claims U.S. Provisional Application No. 61/092,929, filed on Aug. 29, 2009.

FIELD OF THE INVENTION

The present invention provides a method and apparatus for combining the Seebeck Effect that converts heat to electrical power with superconducting polymers that efficiently conduct the electrical power output. The object of this invention is to maximize the useful output of electrical power generated from heat sources by interconnecting all layers of a thermoelectric device to as many superconducting polymer threads as possible.

BACKGROUND OF THE INVENTION

Proven thermoelectric generator technology is well founded in scientific literature and has been satisfying small portable electrical power needs, such as fans, battery chargers and devices that can be used near a heat supply. However, despite its wide application there are several problems with today's thermoelectric devices that must be addressed.

Thermoelectric Generators (Seebeck Effect) have had little impact on supplying electrical power needs for today's world with a Zt factor near one. The Zt factor describes a mathematical relationship between electrical power output and the high temperature Th and cold temperature Tc of available heat sources. A Zt factor of three is required to make thermoelectric generated power competitive on a commercial scale.

Besides the low Zt factor for converting of power, the constant expanding and contracting of the hot and cold layers of a thermoelectric device create cracks in the soldered layers that results in efficiencies dropping off and eventual failure to the device. The operating temperature of today's devices is also limited below optimum operating temperatures by the use of low temperature solders. Lower temperatures within the interface layers results in a lower electric power output from the generator assembly. The low temperature solders Tin (Sn) 95% Antimony (Sb) 5% commonly used in today's devices, re-melt at 235 degrees C., much below the melting point of Bismuth Tellurium Alloys of 650 degrees C. The low operating temperatures with consequent lower interface temperatures make thermoelectric device efficiencies lower.

Still other problems plaguing today's thermoelectric generator industry are the very low output voltages with high output currents. Attempts have been made to make larger, heavier thermoelectric generators to increase voltage, however this had just the opposite result with short life cycles and lower power yields. The larger units have created uneven heat distribution with larger bulky heat sinks and higher internal electrical resistance. These larger units had the opposite result with lower voltage and power yields diminishing in the life cycle of the unit. The use of micron and submicron particles formed by powder metallurgical processes known in the art have had increased power factors, but still much below commercial levels.

There has been recent success by Boston College and MIT (U.S. Pat. No. 7,465,871) to increase the Zt factor with nanometer size composite thermoelectric materials. Still the first major development in 50 years of research of thermoelectric devices has had little use in bringing thermoelectric power generators to a commercial level. It is widely theorized that the smaller the particle size of thermoelectric Bismuth Tellurium alloys the greater the thermoelectric effect. This is understood to be a positive relationship between phonon scattering and good electrical conductivity. It is understood that an ideal thermoelectric device is one that has poor heat (phonon) conduction with very good electrical (electron) conductivity.

SUMMARY OF THE INVENTION

The present invention minimizes all of the technical engineering problems found in today's thermoelectric devices. In particular, it is a primary object to provide a Zt factor at commercial power generating levels of at least three. It is also an object to solve the cracking problem experienced with low temperature solders due to temperature gradients and the thermal expansion of the layers. It is also the object of the present invention to increase the output voltage and reduce the internal electrical resistance through superconducting polymers. These and other objects of the invention will be evident from the following description and drawings.

The present invention relates to methods and materials with process procedures to produce thermoelectric semiconductor layers connected through superconducting polymer coatings, increasing the voltage and power density. A process of eliminating solder for a solder-less thermoelectric assembly that is held together by mechanical pressure is still another object of this invention.

The present invention applies polymers to the surfaces of thermal conducting layers and semiconductor layers that are assembled in a stack to form a thermoelectric generator. Dopants are often added to polymer coatings to alter the properties of the polymers by enhancing the production of free electrons and therefore promote use as room temperature superconductors. For purposes of clarity the coatings made from polymers with a dopant added will be referred to as doped polymer coatings. Laboratory findings show that doped polymer coatings do not have appreciable superconducting properties until they are activated by the processes taught in the present invention. Therefore the doped polymer coatings will be referred to as superconducting polymer coatings only after at least one of UV, microwave, polar magnetic or DC electrical activating processes has been completed as addressed in FIG. 10. Furthermore the mechanism for transporting electrons through the superconducting polymer will be referred to in this document as superconducting polymer threads. Laboratory experiments have also shown that superconducting polymer coatings maintain their superconducting properties after being carbonized due to operation at elevated temperatures. For purposes of clarity in this patent application the term superconducting polymer will be used to refer to the as coated and carbonized condition of the superconducting polymer.

The interconnecting superconducting polymer coatings are a joined together by "cooper paired" electrons that can be of infinite lengths through layers of multiple size thermoelectric devices. The polymers that are the subject of this invention include but are not limited to the non-conjugated, conjugated and saturated polymers, having unique magnetic and electrical properties with cooper pairing electrons as conventional super conductors. The polymers of this invention are superconductive at room temperatures. The superconductive polymer survive high temperatures of a thermoelectric device as a carbonized polymer between the tightly pressed layers of the thermoelectric device. Also, for purposes of clarity in this patent application electro-deposition as referred to in FIG. 14 and FIG. 15 means the electrophoretic process or the electrochemical polymerization process.

It is an object of the present invention to develop effective processes to build thermoelectric electrical generators as well as Peltier devises for cooling and heating using superconducting polymers, which have superconducting polymer threads.

It is also an object of the present invention to develop high temperature thermoelectric devises that operate at the highest theoretical temperatures that can be achieved using carbonized superconducting polymer threads of this invention.

It is also an object of the present invention to develop thermoelectric devices that can expand and contract without damaging the interconnecting superconducting polymer threads. The flexing and stretching super conducting polymers of this invention, will tolerate different thermo expansion coefficients of materials used within a thermoelectric device.

There are a number of issued patents and published patent applications disclosing thermoelectric devices including a heat source, heat sink, P and N Type semiconductor thermoelectric alloys and an electrical load: The patent and published application to Grigorov et al. (U.S. Pat. No. 6,552,883 and US2004/0246650) disclose a thermoelectric generator including superconducting polymers formed with oxidized atactic polypropylene but lacks the teachings of increased superconducting polymer threads by using dopants in combination with sintered copper heat conducting elements and a cryogenically prepared and applied device to increase pressure between components that all have similar effects on conductivity. It also lacks any reference to pulsed output voltage using FET switches.

The patent of Johnson et al. (U.S. Pat. No. 6,121,539) discloses a thermoelectric conductive polymer device, but lacks a teaching of entire heat conducting layers including fins or references to superconductivity, increased contact pressure between elements and pulsed output voltage using FET switches are also lacking.

The patents to Schroeder (U.S. Pat. No. 5,597,976) now abandoned and U.S. Pat. No. 5,393,350 now abandoned) disclose metallic superconductor like thermoelectric devices and employs pulsed electrical output using high speed but not specifically FET switches. It lacks a teaching of superconducting polymers, sintered thermal elements and increased inter-component pressure to further increase conductivity.

The abandoned application to Schroeder et al. (US2003/0217766) discloses a thermoelectric device with sintered ceramic semiconductor elements, MOSFET switches to pulse the electrical output, propylene glycol to slow cool the wafer in the mold and a pressure applying T-Bolt band to increase electrical and thermal conductivity. However Schroeder et al. lacks a teaching of sintered copper heat carrying components, superconducting polymers and a cryogenically stretched device for applying pressure to further increase conductivity.

The published application to Carver (US2008/0303375) discloses a field response material to make thermal energy for heating a thermoelectric device. It lacks disclosure of sintered thermal elements and increased inter-component pressure to further increase conductivity as well as FET switches to control a pulsed power output. It also lacks disclosure of polymeric superconductors, sintered thermal elements and increased inter-component pressure to further increase conductivity.

It is an object of the present invention to make it possible to combine a very wide range of thermoelectric energy conversion materials that either currently exist or that will be developed over the life of this patent, into efficient energy conversion systems that are easily used in the field of energy harvesting, It is a further object of the present invention to stimulate increased power output from the wide range of thermoelectric materials that either currently exist or that will be developed during the life of the patent.

It is still a further object of the present invention to provide an inexpensive, repeatable, forgiving and reliable method of preparing the thermoelectric devices for assembly.

It is still a further object of the present invention to provide a similarly inexpensive, repeatable, forgiving and reliable method of assembly of a thermoelectric generator or Peltier device for cooling, heating or atmospheric water harvesting.

It is still a further object of the present invention to provide alight weight, small, inexpensive and reliable thermoelectric device that generates electricity using solid, liquid or gaseous fuels including but not limited to petroleum based liquids or gases, coal, biological fuels, chemical reactions and heat from plasma arc.

It is still a further object of the present invention to provide alight weight, small, inexpensive and reliable replacement for the Sterling engines that are currently used to convert solar radiation gathered by concentrated solar collectors into electrical energy.

It is still a further object of the present invention to provide alight weight, small, inexpensive and reliable replacement for the Sterling engines in combination with any non-solar heat source.

It is still a further object of the present invention to provide alight weight, small, inexpensive and reliable device for co-generation of power from waste heat of power plants or where ever heat is being discarded.

It is still a further object of the present invention to provide alight weight, small, inexpensive and reliable device for conversion of vehicle exhaust gas heat into electrical power for accessories or to increase the vehicle's overall efficiency.

It is still a further object of the present invention to provide alight weight, small, inexpensive and reliable system for conversion of heat from geothermal sources to electrical energy.

It is still a further object of the present invention to provide alight weight, small, inexpensive and reliable system for generating electrical energy from the temperature difference from one body of water or between water at different depths in the same body of water.

It is still a further object of the present invention to provide alight weight, small, inexpensive and reliable system for generating electrical energy from the temperature difference between living organisms and the ambient conditions.

It is still a further object of the present invention to provide alight weight, small, inexpensive and reliable system for generating electrical energy from the temperature difference between the atmosphere and bodies of water, It is still a further object of the present invention to provide alight weight, small, inexpensive and reliable system for generating electrical energy from the temperature difference between air that is unsaturated and saturated with water vapor.

It is still a further object of the present invention to provide a solder-less assembly of state of the art devices that convert various forms of energy into electrical power.

It is still a further object to provide devices and systems that provide all of the aforementioned features for conversion of light, acoustic, chemical, mechanical, refrigeration, heating and other forms of energy, alone or in combination being converted to electrical energy.

BRIEF DESCRIPTION OF THE SEVERAL VIEWS OF THE DRAWING(S)

Figure 1B:
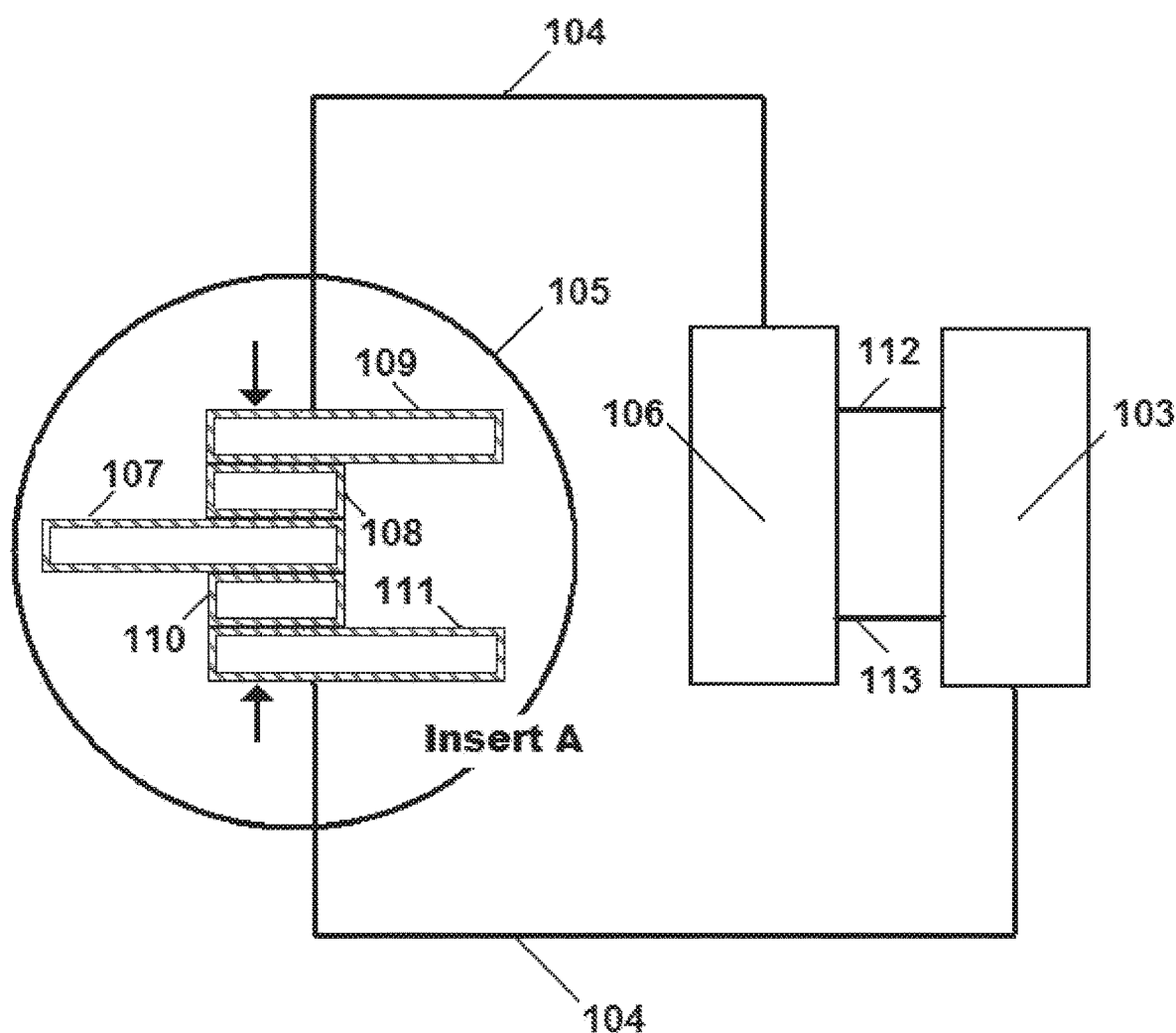

FIG. 1a is a diagrammatic cross section of a thermoelectric stack of the preferred embodiment of the present invention, FIG. 1b is a diagrammatic cross section of Insert A of FIG. 1a including a circuit diagram of the power output circuit, FIG. 2 is a block diagram of the process for making hot and cold layers from metal bar stock, FIG. 3 is a block diagram of the process for making hot and cold layers from the powdered metal process, FIG. 4 is a block diagram of the process for making hot and cold layers with an integral semiconductor layer, FIG. 5 is a block diagram for making semiconductor layers from the Bridgeman molding process, FIG. 6 is a block diagram for forming semiconductor layers and concurrent superconducting polymer coating with the direct melting process, FIG. 7 is a block diagram of the process for making semiconductor layers from the powdered metal process.

Figure 12A:
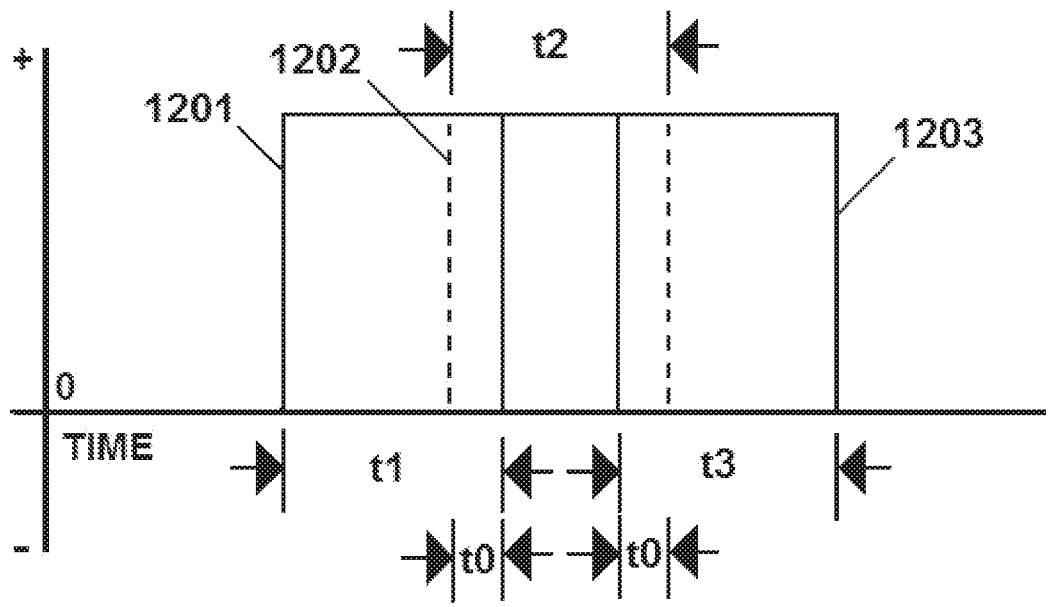
Figure 12B:
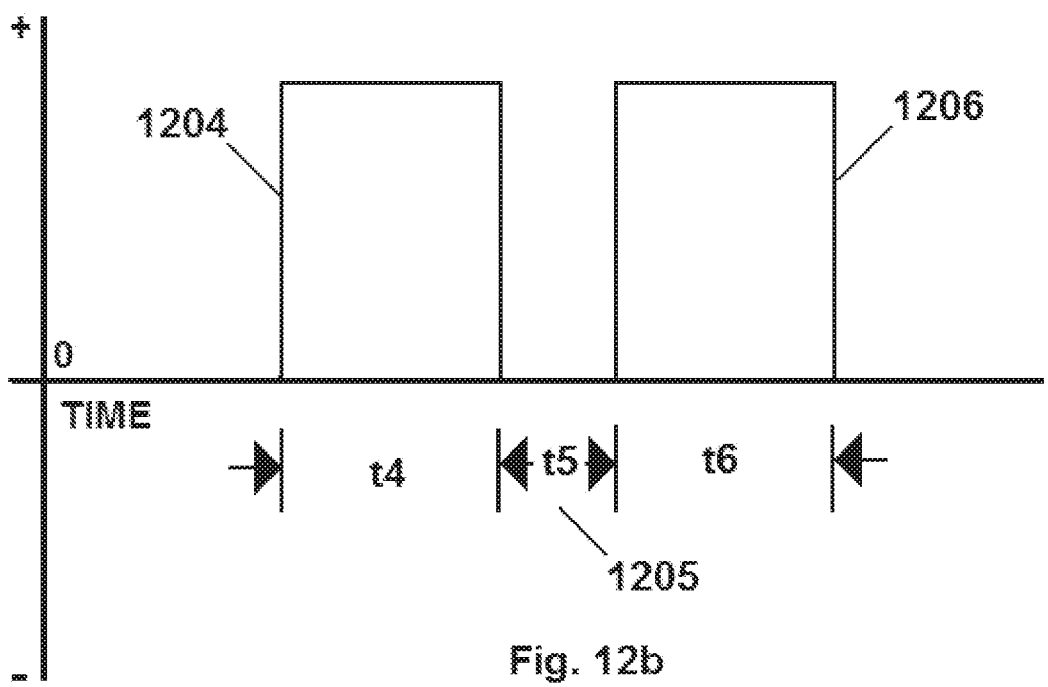
Figure 19A:
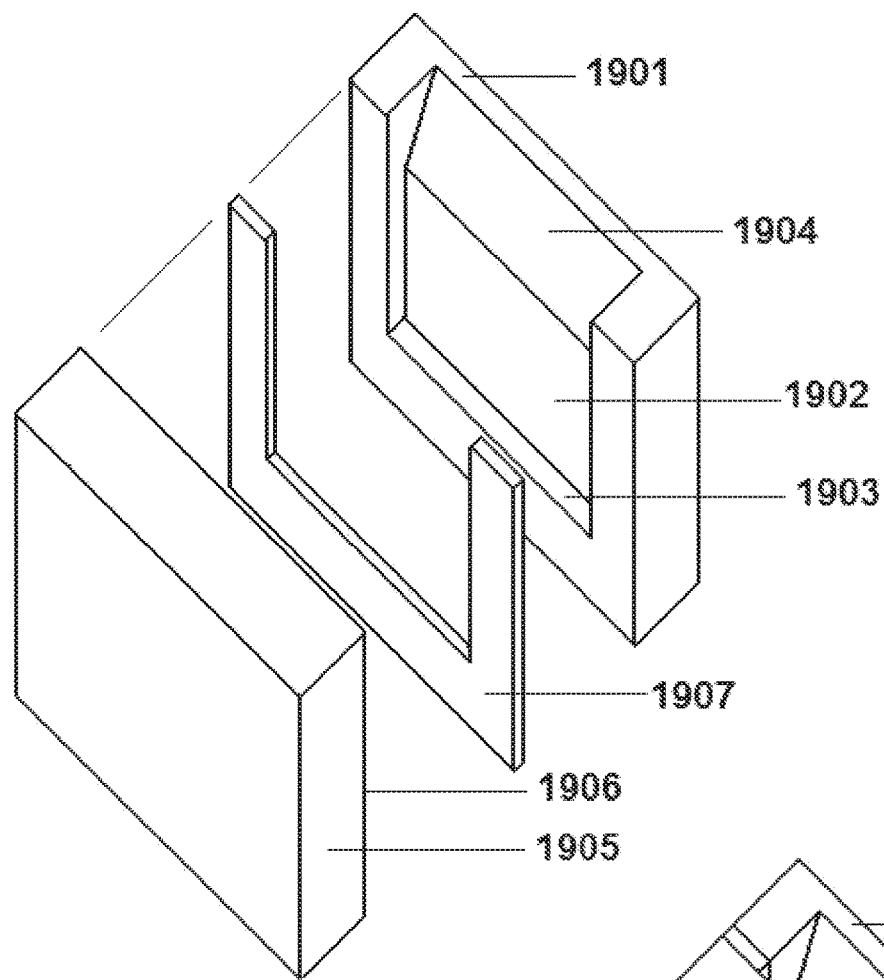
Figure 19B:
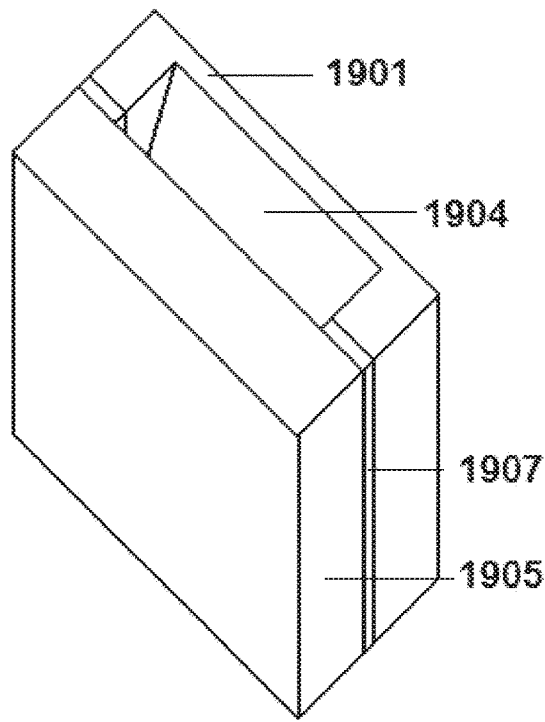
Figure 21A:
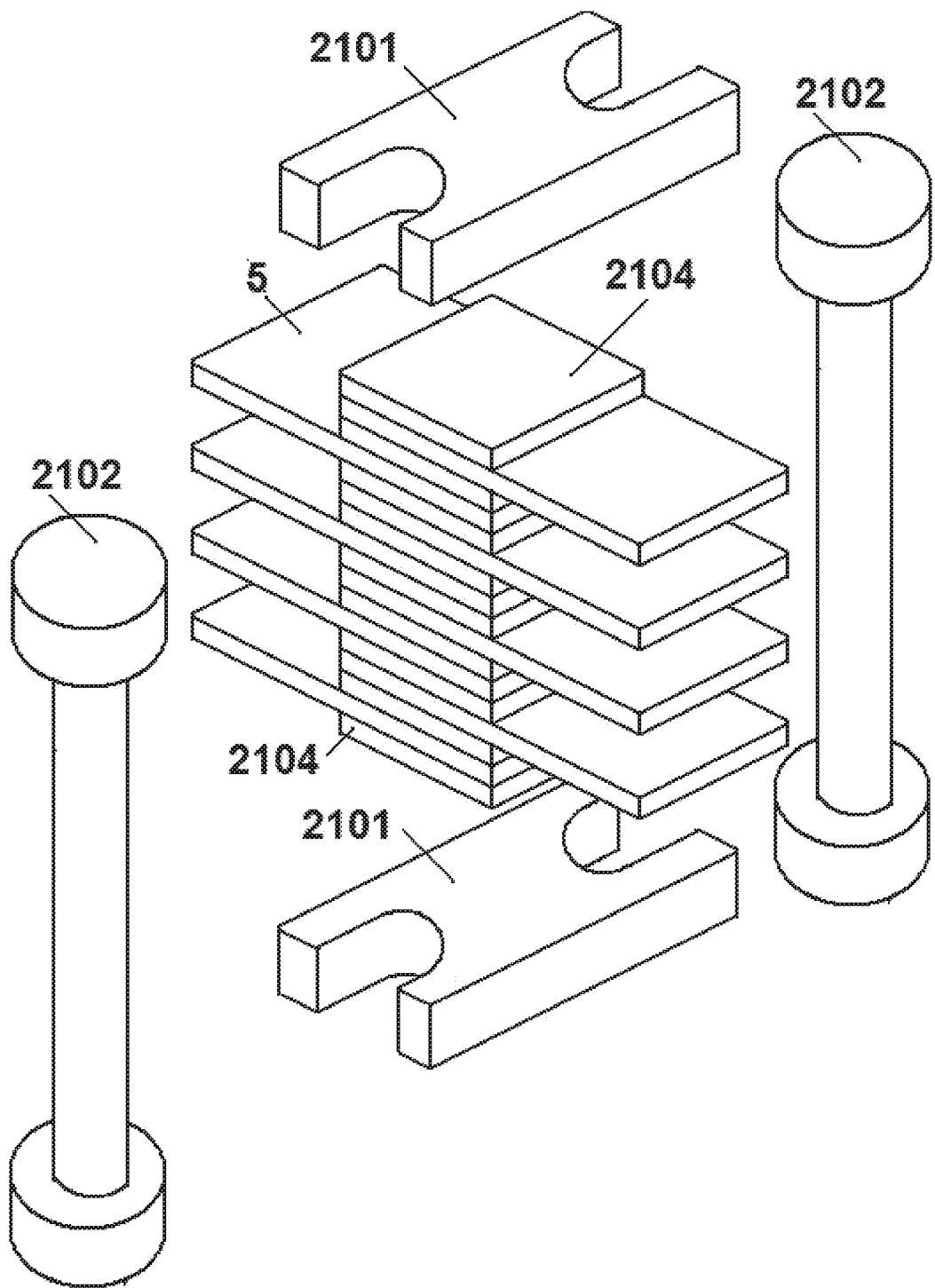
Figure 21B:
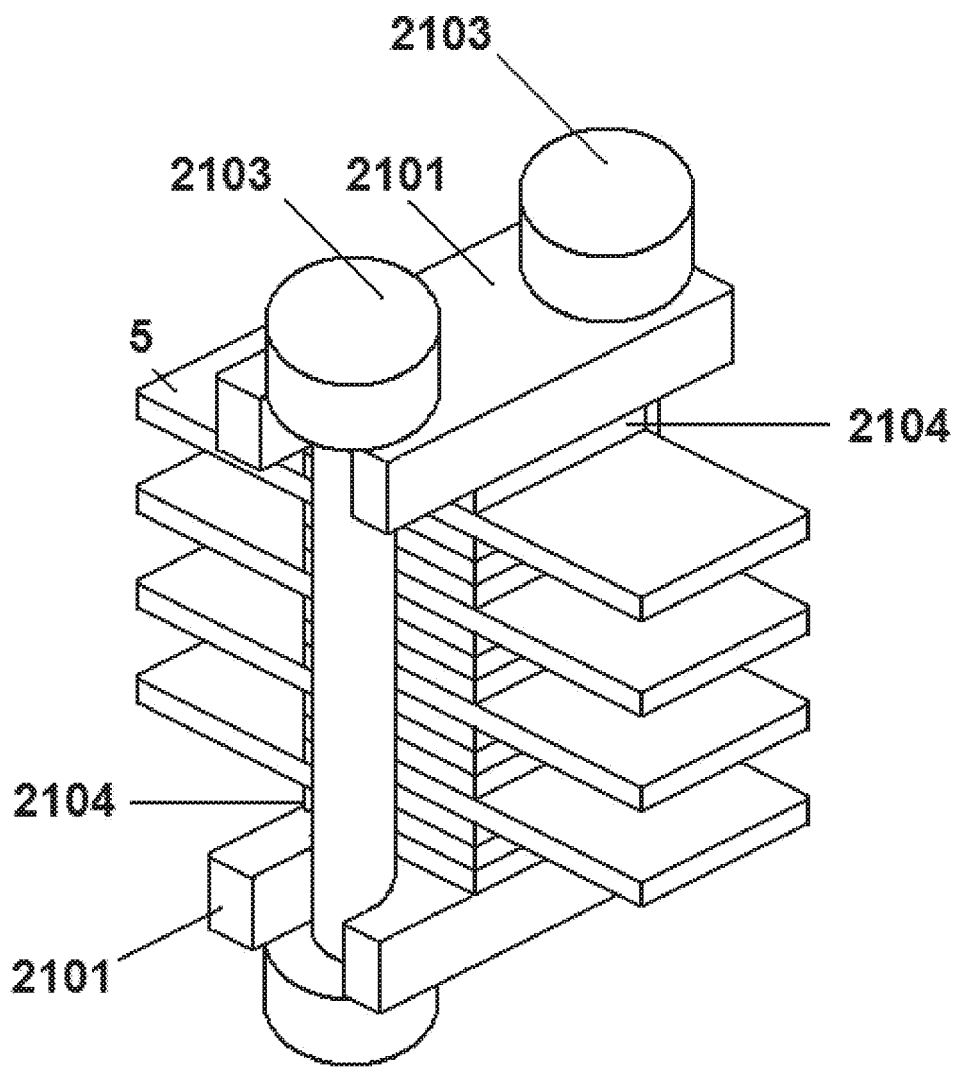

FIG. 8 is a block diagram of the process for coating layers using the propylene glycol process, FIG. 9 is a block diagram of the process for coating layers using the atactic polypropylene process, FIG. 10 is a block diagram of the superconducting polymer curing process, FIG. 11 is a block diagram of the process for electric field conditioning of the energy converter assembly, FIGS. 12a and 12b illustration of two alternative switching mechanism modes of operation, FIG. 13 is a block diagram of the process for coating layers with superconducting paste, FIG. 14 is a block diagram of the process for using the electro-deposition process for producing coatings of superconducting polymer layers, FIG. 15 is a block diagram of the process for superconducting polymer coating assembled layers using electro-deposition, FIG. 16 is a block diagram of the process for coating layers with superconducting polymer during the semiconductor layer formation process, FIG. 17 is a block diagram of the process of activating the superconductivity of polymer coated layers, FIG. 18 is a block diagram of the process of further activating the superconductivity in doped polymer coated layers, FIG. 19a is an exploded view of a carbon block mold, FIG. 19b is a assembled view of a carbon block mold, FIG. 20 is a block diagram of the process for installing a cryogenic member, FIG. 21a is an exploded view of the hardware for installing a cryogenic member, FIG. 21b is perspective view of a thermoelectric stack compressed by a cryogenic member,

DETAILED DESCRIPTION OF THE PREFERRED EMBODIMENT OF THE PRESENT INVENTION

The preferred embodiment of the present invention is an apparatus for converting thermal energy to electrical energy with the use of superconducting polymer threads.

FIGS. 1a and 1b, shows a cross sectional view of a single module (A) of the present invention assembled between multiple modules of the preferred embodiment of the present invention that operates as thermoelectric generator by converting heat energy into electrical energy. The basic principle of operation of the thermoelectric generator is that heat from heat source 101 travels through hot layer 107 to semiconductor layers 110 and 108 where the thermal energy is converted into electrical energy. Cold layers 109 and 111 conduct any excess heat to the heat sink 102 where the heat is discarded.

The components of the preferred embodiment of the present invention are a heat source 101 which is forced air, but may be any solid, liquid or gas at an elevated temperature, a heat sink 102 which is also forced air, but may be any solid, liquid or gas at equal or lower temperature than the temperature of the heat source 101. An electrical load 103 of FIG. 1b, is connected electrically to the thermoelectric stack 105 by electrical conductors 104. The preferred embodiment is explained as using a stack of thin layers having a flat planar relationship to each other however the spirit of the invention extends to any physical size and shape of the thermoelectric and heat carrying elements including but not limited to toroidal and tubular. A switching mechanism 106 further connects the electrical load 103 to stack 105.

The stack 105 is made up of layers as shown in (A) and consists of a sintered copper layer 107 for conducting heat from the heat source 101 to the P-Type semiconductor layer 108 and N-Type semiconductor layer 110 for converting heat energy to electrical energy, a sintered copper layer 109 for conducting excess heat from layer 108 to the heat sink 102 and also conducts electrical energy from the stack 105 to the load 103. In addition a N-Type semiconductor layer 110 for converting heat energy to electrical energy, and a sintered copper layer 111 for conducting excess heat from layer 110 to the heat sink 102 and also conducts electrical energy from the stack 105 to the load 103. All of the layers of the stack 105 are coated with a superconducting polymer for carrying electrons (un-shown) and impeding the flow of phonons (un-shown) through superconducting polymer threads (un-shown) to adjoining sintered copper layers 107, 109 or 111, or P-Type semiconductor layer 108, or N-Type semiconductor layer 110. A cryogenically applied metallic member applies 5,000-30,000 PSI pressure to the top and bottom of the stack at Insert A to insure good thermal and electrical contact throughout the stack 109, 108, 107, 110, 111 of Insert A.

FIG. 1b, shows a sectional view of a single module (Insert A) assembled in the electrical circuit of the preferred embodiment of the present invention. The switching mechanism 106 connects load 103 across the stack 105. The switching mechanism 106 connects the load through two electrical paths 112 and 113 typically to convert the direct current output from the stack 105 to an alternating current 103. An important feature of the preferred embodiment of the present invention is that the electrical path 113 be established before the electrical path 112 is severed as illustrated in FIG. 12a. An alternative embodiment having a quiescent period between the breaking of first path 112 and establishment of a second path 113 is illustrated in FIG. 12b.

Hot layer 107 as well as cold layers 109 and 111 are made of materials that are good conductors of heat and electricity. The material for making hot and cold layers of the preferred embodiment of the present invention is, but is not limited to copper. Block diagrams of process steps for forming the hot and cold layers of the preferred embodiment of the present invention are found in but not limited to FIG. 2, FIG. 3 and FIG. 4. The process of FIG. 4 forms semiconductor layers that are integral with the hot and cold layers. Other combinations of materials and processes that can be utilized but are not limited to in the formation of hot and cold layers include electrically conducting, semi-conducting and non-conducting materials, thermally conducting, refractory or insulating materials or materials having physical properties of solid, crystalline, lattice structure, amorphous, non-porous, granular, micro-particulate, nano-particulate, porous metal and non-metal structures and are bound together by sintering, cohesive bonds, adhesive bonds, cementitious materials, polymers and epoxies and any one or any combination of the aforementioned materials or processes.

The cold layers 109 and 111 as well as the hot layer 107 are optionally coated with a diffusion barrier to prevent metal ions from migrating into the adjoining layers. The ion diffusion barrier coating of the present invention is but is not limited to Nickel that can be applied with any of the processes well known in the art.

Layer 108 of the preferred embodiment of the present invention is a N-Type semiconductor. The materials for making the N-Type semiconductors for the preferred embodiment of the present invention are but are not limited to Bismuth-Tellurium-Selenium, or any N-Type thermoelectric semiconductor material known in the art.

Layer 110 of the preferred embodiment of the present invention is a P-Type semiconductor. The materials for making the p-type semiconductor are Bismuth-Tellurium-Selenium and Antimony or any P-Type thermoelectric semiconductor material known in the art.

Other combinations of materials and processes that can be utilized but are not limited to in the formation of N-Type or P-Type layers may include electrically conducting, semi-conducting and non-conducting materials, thermally conducting or low thermally conducting, refractory or insulating materials or materials having physical properties of solid, crystalline, lattice structure, non-porous, granular, micro-particulate, nano-particulate and porous structures and are bound together by sintering, cohesive bonds, adhesive bonds, cementitious materials, polymers, metals, epoxies and any one or any combination of the aforementioned materials or processes.

All of the layers 107, 108, 109, 110 and 111 are coated with a conductive hydrocarbon typically in the form of a superconducting polymer to enhance electrical conductivity through superconducting polymer threads. The specific coatings of the preferred embodiment of the present invention are but not limited to propylene glycol derivatives applied using the method steps but not limited to the process steps of FIG. 8 or atactic polypropylene applied using the method steps but not limited to the process steps of FIG. 9 in either case followed by the conductive polymer coating curing process but not limited to the process steps of FIG. 10.

The major breakthroughs of the preferred embodiment of the present invention solve the inherent engineering problems of thermoelectric devices.

The first breakthrough of the preferred embodiment is achieving a superconducting polymer coating on the P-Type and N-Type semiconductor layers 108 and 110 without oxidation of the semiconductor materials. This is accomplished by use of the process of FIGS. 6 and 16 that forms superconducting polymer threads as the semiconductor material is cooling in the mold. The disadvantage of this process is that any finishing of the cast semiconductor layers after casting will remove the superconducting polymer and promote oxidation of the semiconductor material. The semiconductor layer shrinks unevenly in the mold creating irregularities that are not conducive to intimate contact with adjoining layers in a stack 105. The preferred embodiment of the present invention therefore uses the cast semiconductor layers in the as cast condition and builds up the thickness of the superconducting polymer to form long superconducting polymer threads using the processes of FIG. 14 to a thickness greater than the dimension of the as cast surface irregularities. Subsequent processing the surface of the superconducting polymer through thermal deformation is used to promote intimate contact between thickly coated adjacent layers in the stack 105.

The second breakthrough of the preferred embodiment of the present invention is in reaction to the thermal expansion of the electro thermal components of the stack 105. The Copper hot layers 107 could expand as much as 80 microns when heated 121 degrees Celsius by the heat source 101. Assuming that the heat sink 102 remains at ambient temperature the cold layers 109 and 111 do not expand. Therefore the two superconducting polymer layers between layer 107 and 108 could be exposed to a relative shift of 40 microns. The present invention depends on the thickness of the superconducting layers and the resilient properties of the strong attractive ionic bonds of superconducting polymers under electric load, to maintain superconducting polymer threads while undergoing the sheer stress due to thermal expansion.

The third breakthrough of the preferred embodiment of the present invention is to replace the cohesive bonding that is expected from the solders used in the prior art as well as the spring biased band of the toroidal prior art thermoelectric devices. The preferred embodiment of the present invention utilizes a resilient member having a single component that generates the holding force as well as applying the force equally to all layers. The material of the resilient member is conditioned under cryogenic temperature, expanding the original shape. The resilient member is assembled over the stack 105 and allowed to warm to room temperature. As the resilient member warms it contracts and applies a evenly distributed force to all layers of the stack 105 especially in a toroidal thermoelectric generator or any appropriate configuration.

The fourth breakthrough of the preferred embodiment of the present invention allows the conversion of heat into electrical energy at high temperatures. The polymers that are coated and made superconducting per the inventive processes at FIGS. 8, 9, 10, and 14-18 continue to be superconducting after being carbonized.

The fifth breakthrough of the preferred embodiment of the present invention is a cooling affect of the cold thermo conductive layers during the conversion of heat to electrical energy. This effect shows that the inventive thermoelectric process herein described produce a device that will operate at a higher efficiency than can be explained exclusively by the temperature difference between the heat source and the heat sink.

FIG. 2 is a block diagram of the process for making thermal conductor hot and cold layers out of metal bar stock of the present invention. In process step 201 the bar stock is cut to the appropriate size for the hot and cold layers. In process step 202 the layers are coated per the atactic polypropylene process of FIG. 9 or the propylene glycol— coating processes of FIG. 8. This is followed by process step 203 calling for curing the coating using the superconducting polymer curing process of FIG. 10.

FIG. 3 is the process for making hot and cold layers for the preferred embodiment of the present invention using the powder metal process of sintering. In process step 301, hot and cold layers are formed under pressure into appropriate size and density of 88-98% using copper powder in the micro to nanometer size range. This is followed by process step 302 where the formed hot and cold layers are sintered and annealed in a reducing atmosphere near the melting temperature of copper. The next process step 303 calls for coating the sintered and annealed hot and cold layers using the atactic polypropylene process of FIG. 9 or the propylene glycol coating processes of FIG. 8. The final process step 304, cures the coating using superconducting polymer curing process of FIG. 10.

FIG. 4 is a block diagram for the process to make hot and cold layers with an integral semiconductor layer. Process step 401 requires a supply of formed layers from the metal bar stock process of FIG. 2 or the powdered metal process of FIG. 3. This is followed by process step 402a where a layer of N-Type or P-Type semiconductor material is deposited on the metal layer using but not limited to electroplating, vapor deposition, vacuum deposition, plasma sputtering processes. Alternatively a composite 402b of P-Type and N-Type particles suspended in a polymer can be applied by any appropriate process. The resulting part is then coated in step 403 using atactic polypropylene coating process of FIG. 9 or the propylene glycol coating processes of FIG. 8. Lastly process step 404 the coating is cured using the superconducting polymer curing process of FIG. 10.

FIG. 5 is a block diagram for semiconductor layer formation using the Bridgeman molding process. The first process step 500 calls for measuring P-Type or N-Type semiconductor material in the proper proportion. At step 501 the P-Type or N-Type semiconductor materials thoroughly mixed. Melting of the P-Type or N-Type semiconductor mixture commences at step 502. In step 503 the mixture is cooled slowly to form a thermoelectric ingot followed by slicing the ingot into layers of appropriate size at step 504. Step 505 calls for lapping, grinding or polishing the slices of the ingot. At step 506 the layers are annealed in a reducing atmosphere. Annealing is followed by an optional coating process 507, of each layer with metal ion diffusion barrier which is normally done with Nickel. Step 508 calls for coating the semiconductor layer using the atactic polypropylene process of FIG. 9 or the propylene glycol coating processes of FIG. 8. The last step 509 is curing the coating using the superconducting polymer curing process of FIG. 10.

FIG. 6 is a block diagram of the process for semiconductor layer formation using the direct melting process. The first step 601 calls for measuring P-Type or N-Type semiconductor material in the proper proportion. At step 602 one melts the measured semiconductor material in carbon crucible. This is followed by step 603 of forming a mold cavity the thickness of finished layers from a mixture of fly ash, sand or other mold material with propylene glycol or atactic polypropylene solution. At step 604 the molten measured semiconductor material is poured into the mold. In step 605 the solution heated by the molten semiconductor material producing thick white fumes as the semiconductor material cools. After cooling, process step 606 is to remove the coated semiconductor material from mold. During process step 607 the cooled semiconductor material is cut into appropriate layer sizes.

FIG. 7 is a block diagram of semiconductor layer formation using the powdered metal process. Step 701 starts the process by measuring the P-Type or N-Type semiconductor material in the proper proportion. At step 702 one forms measured semiconductor layers under pressure into appropriate size and density of 90-98% using powder semiconductor material in the micro to nano size range. Step 703 subsequently sinters and anneals the layers in reducing atmosphere at a temperature of near melting temperature. Lapping, grinding or polishing of the layer surfaces is performed at step 704. This is followed at step 705 by annealing each layer in a reducing atmosphere. The next step 706 is optional calling for coating of the layer with metal ion diffusion barrier which is commonly a coating of Nickel. As in the other layer formation processes at step 707 the layer is coated using atactic polypropylene process of FIG. 9 or propylene glycol coating processes of FIG. 8. Lastly at process step 708 the coating is cured using the superconducting polymer curing process of FIG. 10.

FIG. 8 is a block diagram of the propylene glycol coating process. Step 801 calls for pouring propylene glycol into container approximately ⅛ to ¼" deep. At step 802 a screen is set into the container suspended above the propylene glycol. The layers are then suspended on the screen that has been placed above the level of the propylene glycol at step 803. Step 804 calls for covering the container partially. At step 805 the container is heated until white fumes/mist fills the container. Step 806 calls for sustaining the fume/mist around the substrate for 20 minutes allowing propylene derivative to form and coat the substrate. This is followed by process step 807 calling for curing the coating using the superconducting polymer curing process of FIG. 10.

FIG. 9 is a block diagram of an atactic polypropylene coating process where atactic polypropylene heptane and dopant are supplied at step 900 followed in step 901 where the atactic polypropylene is dissolved in heptane. This is followed by step 902 where dopants are added to the solution. In step 903 dip, Spray coat, brush, sponge or any other application method to coat the layer with the solution. At step 904 one may apply Atactic Polypropylene solution to layer using any method. This is followed by process step 905 calling for curing the coating using the superconducting polymer curing process of FIG. 10.

FIG. 10 is a block diagram of a superconducting polymer curing process. The process starts with step 1001 where both sides of coated substrate or layer are exposed to UV light for one hour. (this step and following two steps may be combined or performed in any order). At step 1002 both sides of substrate or layer are exposed to microwave radiation for five minutes. Step 1003 heats the substrate or layer on hot surface to 100deg.C for ten minutes. Lastly step 1004 cools the coated layer in air.

FIG. 11 is a block diagram for the electric field conditioning of the energy converter assembly to insure superconductivity and thermal contact between layers and coatings to insure superconductivity and low thermal resistance between layers and coatings. The process starts at step 1101 by connecting the negative terminal of a DC power supply or pulse width modulator to all of the hot layers and the positive terminal to all of the cold layers, placing the P-Type and N-Type semiconductors in a parallel electrical circuit.

This is followed by step 1102 where the power source is energized for a time that is a function of the parameters of the apparatus to condition the conductive paths. The next step 1103 is to energize the power source with the terminals reversed for a time that is a function of the parameters of the apparatus to condition the semiconductor paths. Lastly at step 1104 one is to confirm conditioning of entire apparatus by measuring its conductivity with the parallel circuit removed, FIG. 12*a* shows a timing diagram of the operation of the switching mechanism 106 shown in FIG. 1*b* of the preferred embodiment of the present invention. 1201 represents the period t1, that the stack 105 is connected to the load 103 through conductor 112 and conductor 104. 1202 represents the period t2, that the stack 105 is connected to the load 103 through conductor 113 and conductor 104 and t0 is a period when stack 105 is connected to the load 103 through conductors 112, 113 and 104 and is referred to as an overlap. It can be seen that 1203 represents another period t3 that the stack 105 is connected to the load 103 through conductor 112 and conductor 104 with another overlap t0.

FIG. 12*b* shows an alternative timing diagram of the operation of the switching mechanism 106 shown in FIG. 1*b*. In this mode of operation 1204 represents the period t4, that the stack 105 is connected to the load 103 through conductor 112 and conductor 104. 1206 represents the period t6, that the stack 105 is connected to the load 103 through conductor 113 and conductor 104. 1205 represents a period t5 when stack 105 is in a quiet period not being connected to either conductor 112 nor 113.

FIG. 13 is a block diagram of a process for coating layers with superconducting paste. The process starts with step 1301 where a supply of a particulate dopant is attained. At step 1302 one gains a supply of polymer in solution. This is followed by step 1303 of mixing the particulate and solution to form a paste. At step 1304 one applies the paste to all or part of a layer. This is followed by step 1305 where two or more layers are assembled mechanically. The layers are then heated at step 1306. Step 1307 finishes the process by applying DC voltage to assembled layers during heating.

FIG. 14 is a block diagram of coating layers using the electro-deposition process for coating of superconducting polymers. The process starts by supplying the layers at step 1401 followed by supplying an electrical and polar magnetic cell for coating at step 1402. Step 1403 calls for submerging the layer to be coated in dissolved monomer or polymer. A voltage is applied across the cell at step 1404 in the presence of a polar magnetic field across the cell at step 1405. The coated layer is removed from the cell at step 1406.

FIG. 15 is a block diagram for the process of superconducting polymer coating assembled layers. The first step 1501 is to supply assembled layers and supply electrical and magnetic cell for coating at step 1502. This is followed by step 1503 of submerging the assembled layers in dissolved monomer or polymer. Step 1504 requires applying a voltage across the cell while applying a polar magnetic field across the cell to satisfy step 1505. Lastly the coated and assembled layers are removed from the cell at step 1506.

FIG. 16 is a block diagram for superconducting polymer coated semiconductor layer formation of the preferred embodiment of the present invention. The process starts with step 1601 where P-Type or N-Type semiconductor material in the proper proportion. Followed by step 1602 where a supply of a solution of a polymer, solvent and dopant is obtained. Step 1603 begins the molding process by forming a carbon mold cavity the thickness of finished layers as seen in FIGS. 19*a* and 19*b* at reference numbers 1903. Step 1604 calls for Insulating the contact edges of the mold as shown in FIGS. 19*a* and 19*b* at reference number 1907. In step 1605 the polymer from step 1602 is applied to the separated mold hales 1901 and 1905 followed by step 1606 where the mold is assembled as in FIG. 19*b* and the two halves are held together with a clamp that is not shown. In step 1607 the mold halves are connected to a supply of electricity while at step 1608 the semiconductor material from step 1601 is melted in a carbon crucible. Subsequently at step 1609 the molten semiconductor material is poured into the mold cavity through the opening shown in FIG. 19*b* at reference number 1904. The operator can now observe that electricity is passing through the superconducting polymer coated cast wafer at step 1610 after which the mold can be disassembled to extract the superconducting polymer coated semiconductor layer at step 1611.

FIG. 17 is a block diagram of the process that activates the superconductivity of the doped polymer or polymer coated layers. The process starts by supplying the doped polymer coated layers at step 1701. Step 1702 calls for supply of the required equipment including a UV light source, polar magnet 1703 and microwave source 1704 respectively. Steps 1705, 1706 and 1707 that call for exposing the layers to UV light, a polar magnetic field and microwave radiation may be performed separately in any order or together simultaneously.

FIG. 18 is a block diagram of process for further activating the superconductivity in polymer or doped polymer coated layers. This process starts at step 1801 to supply assembled layers. Steps 1802 and 1803 call for supplying a heat source directed towards the hot layers and supplying a heat sink directed towards the cold layers respectively. At step 1804 a pulsating DC current is connected across the layer electrical connections by a DC power supply or pulse width modulator. As a result step 1805 will cause Ionized polarons to cross and connect between P-Type and N-Type semiconductors carrying electrons through the polymer. Per step 1806 the polymer coating will impede phonons flow violating the Wiedemann—Franz Law per step 1807 the pulsating current accelerates electron flow making superconducting polymer threads. Subsequently in step 1808 the electrons separate from phonons enhancing the voltage and current flow from the layers which in turn per step 1809 the enhanced flow of electrons triggers Peltier, magneto-caloric and electro-caloric effect causing cold layer to be cool. The last step 1810 produce an increased temperature difference across the semiconductor layers increases Seebeck effect yielding higher voltage and current output.

FIG. 19*a* shows a two piece mold made form carbon blocks. The base of the mold 1901 has a cavity 1902 that is machined in the shape and depth 1903 of a semiconductor layer of the preferred embodiment of the present invention. The base also has a chamfered edge 1904 leading to the top edge of the cavity 1902. The top of the mold is made of a carbon block of similar dimensions to the base and has a flat inside surface 1906. The top 1905 and the base 1901 are separated by a thin electrical insulator 1907.

FIG. 19*b* shows the mold components of FIG. 19*a* assembled and ready for pouring of the molten semiconductor melt. The base 1901 and top 1905 are separated by and in intimate contact with the insulator 1907. The mold components are held in this position by a clamp (un-shown) and the molten semiconductor material (un-shown) is poured into the cavity 1902 through the chamfer 1904 of 19*a*.

FIG. 20 is a block diagram for installing a cryogenic member for applying pressure to a thermoelectric stack resulting in improved thermal and electrical conduction between layers. This process requires a cryogenic cooling source operating at cryogenic temperature at step 2001 and a thermoelectric stack requiring application of pressure to improve contact between layers at step 2002. A cryogenic treatable member made of shape memory materials is called for having a smaller inner dimension (between the headed ends) than the outer dimension of the thermoelectric stack at step 2003. Step 2004 calls for cooling the cryogenic treatable member to cryogenic temperature in the cryogenic cooling source. At this point a mechanical device for stretching members at step 2005 is used to stretch the cryogenic treatable member to a larger inner dimension than the outer dimension of the thermoelectric stack at step 2006.

Quickly removing the cryogenically treatable member from the cryogenic cooling source at step and assembling it around the thermoelectric stack before an appreciable member temperature rise completes step 2007. The assembly is completed at step 2008 where the cryogenically treatable member is allowed to warm to room temperature causing shrinkage of the member thereby applying pressure to the thermoelectric stack.

FIG. 21*a* shows a thermoelectric stack 5 from FIG. 1*a* and FIG. 1*b*. Two spanner plates 2101 are positioned one at the top and one at the bottom of the thermoelectric stack 5. The top and bottom of the stack 5 is electrically insulated from the spanner plates 2101 by insulation layers 2104. The two cryogenically treatable members 2102 are shown in their stretched cryogenically cold condition.

FIG. 21*b* shows the thermoelectric stack 5 after assembly with the two spanner plates 2101 being pressed towards each other by the cryogenic members 2103 that have shrunk due to warming to room temperature. From 5,000 to 30,000 PSI pressure can be developed in the layers of the stack 5 promoting intimate contact and very low electrical resistance.

It is further anticipated that alternate embodiments of the present invention would include surrounding the apparatus with a vacuum, gas or any other substance that would either provide a source of electrons or enhance the performance of the apparatus in any manner whatever.

I claim:

1. A process for generating electrical energy comprising:
   heating a first heat conducting layer;
   passing the heat from the heat conducting layer through first and second semiconductor materials disposed on opposite sides of the heat conducting layer;
   dissipating heat from the semiconductor material via a second heat conducting layer disposed on each of the first and second semiconductor materials; and
   generating electrical current between the first and second semiconductors materials, wherein
   the first and second semiconductor materials and the heat conducting layers are coated with a superconducting polymer.

2. The process of claim 1, wherein the superconducting polymer is atactic polypropylene or a propylene glycol solution.

3. The process of claim 1, wherein the super conducting polymer is cured using a UV light, a microwave radiation and a heat.

4. The process of claim 1, wherein the superconducting polymer is carbonized.

5. The process of claim 1, wherein a heat sink is attached to a cold side of the second heat conducting layer.

6. The process of claim 1, wherein each of the first and second semiconductor materials are a composite layer of a N-Type semiconductor or P-Type semiconductor suspended in a polymer.

7. The process of claim 1, further comprising:
   connecting a DC power source to the first and second semiconducting materials;
   apply a DC current through each of the first and second heat conducting layers and the first and second semiconducting materials for making superconducting polymer threads.

8. The process of claim 7, wherein the DC power source is a pulsating DC power source.

9. The process of claim 1, further comprising applying pressure between the each layer to impede phonon conduction and stimulating an increase in electron flow through the first and second semiconductor materials.

10. The process of claim 9, wherein the first and second heat conducting layers and the first and second semiconductor materials are clamped together with an electrically isolated clamp to apply the pressure between each layer.

11. The process of claim 10, wherein:
   the electrically isolated clamp has an opening smaller than a thickness of the first and second heat conducting layers and the first and second semiconductor materials;
   cooling the clamp to cause the opening to expand under mechanical stretching, permitting insertion of the thickness of the first and second heat conducting layers and the first and second semiconductor materials therein; and
   warming the clamp causes the clamp to shrink and apply pressure to the thickness of the first and second heat conducting layers and the first and second semiconductor materials.

12. The process of claim 1, further comprising:
   disposing a second set of first and second semiconductor materials on opposite sides of a third heat conducting layer, wherein
   the first semiconductor material of the second set being disposed against a fourth heat conducting layer;
   the second semiconductor material shares the second heat conducting layer; and
   the second set of first and second semiconductor materials and the third and fourth heat conducting layers are coated with a superconducting polymer.

13. The process of claim 1, wherein the generation of electrical energy is at a Zt factor of at least three.

14. A process for generating electrical energy comprising:
   heating a plurality of first heat conducting layers, each of the plurality of first heat conducting layers having a first semiconducting layer on a first side thereof and a second semiconducting layer on a second, opposite side thereof;
   passing the heat from each of the plurality of heat conducting layers through the first and second semiconducting layers;
   dissipating heat from the first and second semiconducting layers via a plurality of second heat conducting layers disposed on each of the first and second semiconducting layers opposite a side thereof where each of the first and second semiconducting layers connect with respective ones of the plurality of first heat conducting layers, each of the plurality of first and second semiconducting layers and each of the plurality of the first and second heat conducting layers are coated with a carbonized superconducting polymer; and generating electrical current between the first and second semiconducting layers.

15. The process of claim 14, wherein the superconducting polymer is atactic polypropylene or a propylene glycol solution as a carbon source.

16. The process of claim 14, wherein a heat sink is attached to a cold side of each of the plurality of the second heat conducting layers.

17. The process of claim 14, wherein each of the plurality of the first and second semiconductor materials are a composite layer of a N-Type semiconductor or P-Type semiconductor suspended in a polymer.

18. The process of claim 14, further comprising, while under pressure, impeding phonon conduction and stimulating an increase in electron flow through each of the plurality of the first and second semiconducting layers.

19. The process of claim 14, wherein the generation of electrical energy is at a Zt factor of at least three.

20. The process of claim 14, further comprising preventing cracks between the layers during operation of the process.

\* \* \* \* \*